(12) United States Patent
Watford et al.

(10) Patent No.: US 8,667,374 B2
(45) Date of Patent: Mar. 4, 2014

(54) VIDEO TRANSMISSION SYSTEMS AND METHODS OVER CARRIER ETHERNET

(75) Inventors: Michael Watford, Kanata (CA); Ross Caird, Kanata (CA)

(73) Assignee: Ciena Corporation, Hanover, MD (US)

( * ) Notice: Subject to any disclaimer, the term of this patent is extended or adjusted under 35 U.S.C. 154(b) by 162 days.

(21) Appl. No.: 13/300,944

(22) Filed: Nov. 21, 2011

(65) Prior Publication Data

US 2013/0132789 A1 May 23, 2013

(51) Int. Cl.
*H03M 13/00* (2006.01)

(52) U.S. Cl.
USPC .......................................... 714/776; 370/910

(58) Field of Classification Search
USPC .......................... 714/746, 751, 776; 370/910
See application file for complete search history.

(56) References Cited

U.S. PATENT DOCUMENTS

| | | | |
|---|---|---|---|
| 6,842,868 B1 | 1/2005 | Brown et al. | |
| 7,448,061 B2 | 11/2008 | Richards et al. | |
| 8,091,011 B2 * | 1/2012 | Rajakarunanayake et al. | 714/774 |
| 2005/0169314 A1 | 8/2005 | Beaudoin et al. | |
| 2005/0243842 A1 | 11/2005 | Waitzmann | |
| 2008/0232244 A1 | 9/2008 | Gerstel et al. | |
| 2008/0271096 A1 | 10/2008 | Gazier et al. | |
| 2009/0141703 A1 | 6/2009 | Ghodrat et al. | |
| 2009/0213873 A1 | 8/2009 | Frlan et al. | |
| 2009/0319845 A1 * | 12/2009 | Liu et al. | 714/747 |
| 2011/0019584 A1 | 1/2011 | Raghavendran et al. | |
| 2011/0078532 A1 * | 3/2011 | Vonog et al. | 714/752 |
| 2011/0096676 A1 | 4/2011 | Krzanowski | |
| 2013/0132789 A1 * | 5/2013 | Watford et al. | 714/752 |

OTHER PUBLICATIONS

Lofgren, A.; Lodesten, L.; Sjoholm, S.; Hansson, H., "An analysis of FPGA-based UDP/IP stack parallelism for embedded Ethernet connectivity," NORCHIP Conference, 2005. 23rd , vol., no., pp. 94,97, Nov. 21-22, 2005.*
Metro Ethernet Forum; MEF 8—Implementation Agreement for the Emulation of PDH Circuits Over Metro Ethernet Networks; Oct. 2004; (c) The Metro Ethernet Forum 2004.
MEF—Introducing the Specifications of the Metro Ethernet Forum; Slide Presentation—www.metroethernetforum.org to access full specification.
LEIGH WHITCOM—Harris Corporation; Real-Time Professional Broadcast Signals Over IP Networks; TECHCON Technology Conference. Apr. 2011.

* cited by examiner

*Primary Examiner* — Cynthia Britt
(74) *Attorney, Agent, or Firm* — Clements Bernard PLLC; Christopher L. Bernard; Lawrence A. Baratta, Jr.

(57) ABSTRACT

The present disclosure provides video transmission systems and methods with video data flows transmitted over a Carrier Ethernet Network at Layer 2 with redundancy in order to provide hitless protection switching and uninterrupted video service delivery, such as during periods of asymmetric congestion or hard network failures. In an exemplary embodiment, the video transmission systems and methods provide the redundancy in a manner similar to 1+1 linear protection with hit-less protection switching. In another exemplary embodiment, the video transmission systems and methods provide encapsulated video signals over Ethernet using standardized Carrier Ethernet frames with additional sequencing information. Optionally, the video transmission systems and methods may also include packet-based forward error correction information for additional resiliency. These video transmission systems and methods provide uninterrupted and error-free video during broadcast despite network events such as fiber breaks, equipment failures, congestion, etc.

19 Claims, 10 Drawing Sheets

VIDEO TRANSMISSION SYSTEMS AND METHODS OVER CARRIER ETHERNET

FIELD OF THE INVENTION

The present invention relates generally to networking. More particularly, the present invention relates to video transmission systems and methods with video data flows transmitted over a Carrier Ethernet Network at Layer 2 with redundancy and optionally with error correction in order to provide hitless protection switching and uninterrupted video service delivery, such as during periods of asymmetric congestion or hard network failures.

BACKGROUND OF THE INVENTION

Video transport in provider networks is a relatively new technology. Conventionally, video transport has been accomplished through the use of compressed video data formats and higher layer protocols (e.g., Internet Protocol (IP) over Ethernet). That is, conventional Ethernet is not used as a method for segregating video traffic from standard Ethernet traffic. There are current standards for transporting serial Society of Motion Picture and Television Engineers (SMPTE) Video Signals over IP such as SMPTE 2022-6 "High Bit Rate Media Transport over IP Networks," the contents of which are herein incorporated by reference. However, these standards assume a transport model that uses the public Internet IP infrastructure to transport video signals and does not provide a method of hitless video protection switching. Disadvantageously, the public Internet infrastructure is not ideal for transporting video traffic. Specifically, there is no segregation or prioritization for this traffic and it can therefore be impacted by network congestion. Conventional systems and methods for transport of video traffic over IP do not provide hitless protection during interruptions due to congestion or fiber breaks.

Ethernet is evolving in carrier networks to enable network operators to provide services via Ethernet to end users. In particular, Carrier Ethernet is a general term utilized to cover extensions to Ethernet for carrier level service. For example, these extensions include Operations, Administration, and Maintenance (OAM), standardized services (e.g., E-Line, E-LAN, etc.), ITU-R G.8032v1 and v2 "Ethernet Shared Protection Rings," the contents of which are herein incorporated by reference, and the like. The Metro Ethernet Forum (MEF, metroethernetforum.org) is involved in defining standards for Carrier Ethernet. It would be advantageous to provide video signal transport over Carrier Ethernet Network, for example, in order facilitate the television broadcasts of live events. Video traffic can be carried in Carrier Ethernet Networks conventionally with various forms of protection; however conventional systems and methods do not provide various mechanisms enabling hit-less protection switching.

BRIEF SUMMARY OF THE INVENTION

In an exemplary embodiment, a Carrier Ethernet method includes receiving a video input stream at an ingress node, encapsulating the video input stream into Ethernet packets including sequencing and timing, duplicating the Ethernet packets, transmitting the duplicated Ethernet packets over separate line ports over a network, and receiving the duplicated Ethernet packets at an egress node and processing thereof. The method may further include creating forward error correction packets for the Ethernet packets, and transmitting the forward error correction packets along with the duplicated Ethernet packets. The method may further include, upon receiving the duplicated Ethernet frames at the egress node, performing the steps of ordering the Ethernet packets based on the sequencing, providing hitless protection switching by substituting lost or defective Ethernet packets with received duplicate Ethernet packets with a same sequence number, and repairing the lost or defective Ethernet packets utilizing the forward error correction packets. The method may further include encapsulating the video input stream into Carrier Ethernet frames and adding a sequence number to each of the Carrier Ethernet frames.

The method may further include, upon receiving the duplicated Ethernet frames at the egress node, performing the steps of ordering the Ethernet packets based on the sequence number, and providing hitless protection switching by substituting lost or defective Ethernet packets with received duplicate Ethernet packets with a same sequence number. The method may further include transmitting the duplicated Ethernet packets over separate line ports over the network based on a virtual local area network identification, and, at the egress node, blocking transmission of the received duplicated Ethernet packets. The method may further include, at one or more intermediate nodes, forwarding the duplicated Ethernet packets based on the virtual local area network identification. The method may further include transmitting to the network over a Layer 1 protocol with underlying synchronization, and providing a timestamp in the duplicated Ethernet packets, the timestamp providing a differential time recovery mechanism with the underlying synchronization. The method may further include utilizing Ethernet synchronization status messages between the ingress node and the egress node to convey clock quality and prevent timing loops. The method may further include receiving the duplicated Ethernet packets at a plurality of egress nodes in addition to the egress node and processing thereof. The method may further include receiving the video input stream including an uncompressed video signals at the ingress node.

In another exemplary embodiment, a Carrier Ethernet network includes an ingress node, one or more egress nodes, a network communicatively coupling the ingress node to the egress node, a video signal interfacing the ingress node, and an Ethernet transport system for communicating the video signal from the ingress node to the one or more egress nodes. The Ethernet transport system is configured to transport the video signals through Ethernet frames including sequencing and timing, and the Ethernet transport system is configured to transport the video signals in a duplicated manner for virtually hitless protection switching. The network may further include duplicate paths between the ingress node and the one or more egress nodes, wherein the Ethernet transport system may be configured to encapsulate the video input stream into Ethernet packets including sequencing and timing, and transmit duplicated Ethernet packets each over the duplicate paths. The Ethernet transport system may be configured to provide forward error correction packets for the Ethernet frames, and transmit the forward error correction packets along with the Ethernet frames. The egress node may be configured to order received Ethernet frames based on the sequencing, and provide hitless protection switching by substituting lost or defective Ethernet frames with received Ethernet frames with a same sequence number based on the duplicated manner. The network may further include one or more intermediate nodes on one or more of the duplicate paths, wherein the Ethernet frames are forward based on a virtual local area network identification. The network may further include a Layer 1 protocol between the ingress node and the one or more egress nodes, the Layer 1 protocol including an underlying synchronization, and a differential time recovery mechanism with the underlying synchronization.

In yet another exemplary embodiment, a Carrier Ethernet network device includes one or more interface ports, a video processing block, an Ethernet switch, and a plurality of line ports. The one or more interface ports are configured to interface to a video signal, wherein the video processing block is configured to encapsulate the video signal into a plurality of Ethernet packets with an Ethernet header including sequencing and timing, and wherein the Ethernet switch is configured to forward the plurality of Ethernet packets over a pair of the plurality of line ports. The Ethernet switch may be configured to receive duplicates of a second plurality of Ethernet packets including a second video signal, order the second plurality of Ethernet packets based on sequencing and timing, and block forwarding of the second plurality of Ethernet packets.

BRIEF DESCRIPTION OF THE DRAWINGS

Exemplary and non-limiting embodiments of the present invention are illustrated and described herein with reference to the various drawings, in which like reference numbers denote like method steps and/or system components, respectively, and in which.

DETAILED DESCRIPTION OF THE INVENTION

In various exemplary embodiments, the present invention relates to video transmission systems and methods with video data flows transmitted over a Carrier Ethernet Network at Layer 2 with redundancy in order to provide hitless protection switching and uninterrupted video service delivery, such as during periods of asymmetric congestion or hard network failures. In an exemplary embodiment, the video transmission systems and methods provide the redundancy in a manner similar to 1+1 linear protection with hitless protection switching. In another exemplary embodiment, the video transmission systems and methods encapsulate video signals over Ethernet using standardized Carrier Ethernet frames with additional sequencing and timing information (e.g., an MEF8 header plus a Real Time Protocol (RTP) like header). Optionally, the video transmission systems and methods may also include packet-based forward error correction (FEC) information for additional resiliency. These video transmission systems and methods provide uninterrupted and error-free video during broadcast despite network events such as fiber breaks, equipment failures, congestion, etc.

Figure 1:
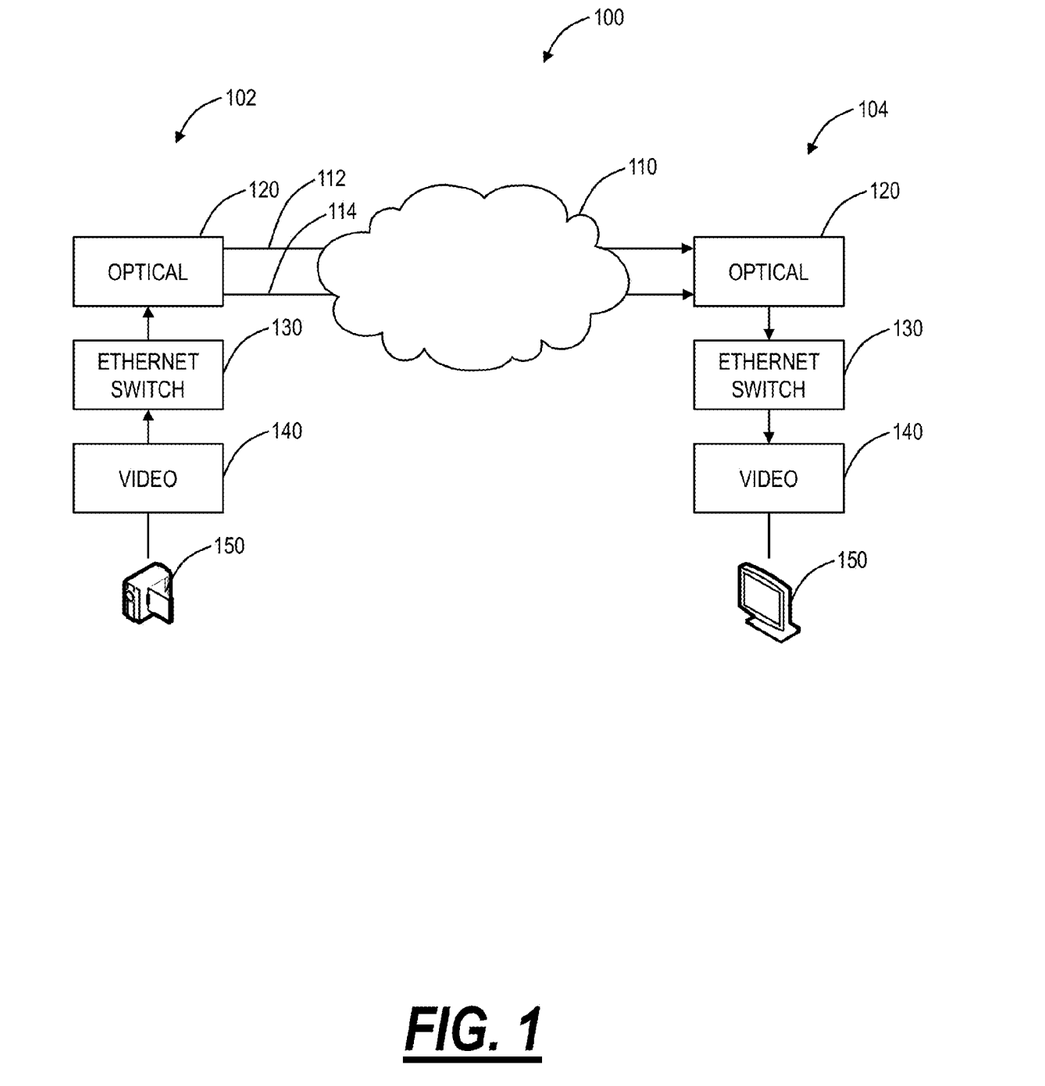
FIG. 1 is a network diagram of a network with two nodes for transport of video data or the like using the video transmission systems and methods.

Referring to FIG. 1, in an exemplary embodiment, a network diagram illustrates a network 100 with two nodes 102, 104 for transport of video data or the like using the video transmission systems and methods. The nodes 102, 104 are interconnected through an optical network 110 which may include a packet switched wide area network (WAN) using Carrier Ethernet or IP multi-label protocol switching (MPLS) encapsulation. Additionally, the network 110 may include various underlying Layer 1 protocols such as Optical Transport Network (OTN), Synchronous Optical Network (SONET), Synchronous Digital Hierarchy (SDH), Ethernet over wavelength; that is, the optical network 110 may generally be referred to as an optical network transporting Ethernet, Ethernet over SONET, Ethernet over OTN, etc. The nodes 102, 104 are interconnected over the network 100 through redundant links 112, 114 which may include geographic diversity over the network 100. The links 112, 114 are terminated through an optical block 120 at the nodes 102, 104. The optical block 120 may include a wavelength division multiplexing (WDM) platform, a multi-service provisioning platform (MSPP), a SONET/SDH/OTN multiplexer, a digital or optical cross-connect, an optical switch, optical interfaces on an Ethernet switch or IP router, or a combination thereof. Ethernet packets are provided from the optical block 120 to an Ethernet switch 130 for processing thereof. The Ethernet switch 130 is configured to provide the Ethernet packets to a video processing block 140 which in turn provides video to end devices 150.

The video transmission systems and methods are configured to provide protected, hitless, and uncompressed video over a Carrier Ethernet network such as the network 100. In an exemplary embodiment, the video transmission systems and methods transport video (or any other type of real-time, sequenced data traffic) over the network 100 at Layer 2 with the links 112, 114 providing redundancy. The links 112, 114 enable hitless protection switching and uninterrupted video service delivery between the nodes 102, 104 including during periods of congestion or network failures. In an exemplary embodiment, the video transmission systems and methods transport uncompressed SMPTE Video Signals over Ethernet using virtual Time Division Multiplexing (TDM) pipes by encapsulating a video payload within standard Carrier Ethernet headers. For example, the standard Carrier Ethernet headers may include MEF8 headers as defined in MEF "Implementation Agreement for the Emulation of PDH Circuits over Metro Ethernet Networks," October 2004, the contents of which are incorporated by reference herein. The video signals may include for example, but not limited to, Serial digital interface-Standard Definition (SDI-SD), Serial digital interface-High Definition (SDI-HD), SDI-3G, Digital Video Broadcasting—Asynchronous Serial Interface (DVB-ASI), Serial Data Transport Interface (SDTI) or HD-SDTI, TDM or dual-link 3G, etc.

Individual flows of video signals may be aggregated into a single 10 Gb/s Ethernet interface on each of the links 112, 114, or alternatively any type of Ethernet interface such as 1 Gb/s, 100 Gb/s, etc., and encapsulated within a Provider Tag (P-TAG) or Q-TAG (IEEE 802.1Q-based tag). These flows may be separated during transport based on Virtual Local Area Network (VLAN) ID. The flows may be unicast or multicast within the Carrier Ethernet Network. The VLAN ID may then be used to drop, forward or block the frames throughout the Carrier Ethernet Network. In various exemplary embodiments, the network 100 may utilized various standards such as IEEE 802.3ae (2002) "Media Access Control (MAC) Parameters, Physical Layers, and Management Parameters for 10 Gb/s Operation", ITU-T G.8264 (2008) "Timing distribution through Packet Networks", ITU-T G.8261 (2006) "Timing and Synchronization Aspects in Packet Networks", IEEE 802.1Q "Virtual LANs" (as a means to an end), and IETF RFC 3550 (2003) "RTP: A Transport Protocol for Real-Time Applications," the contents of each are herein incorporated by reference.

Figure 2:
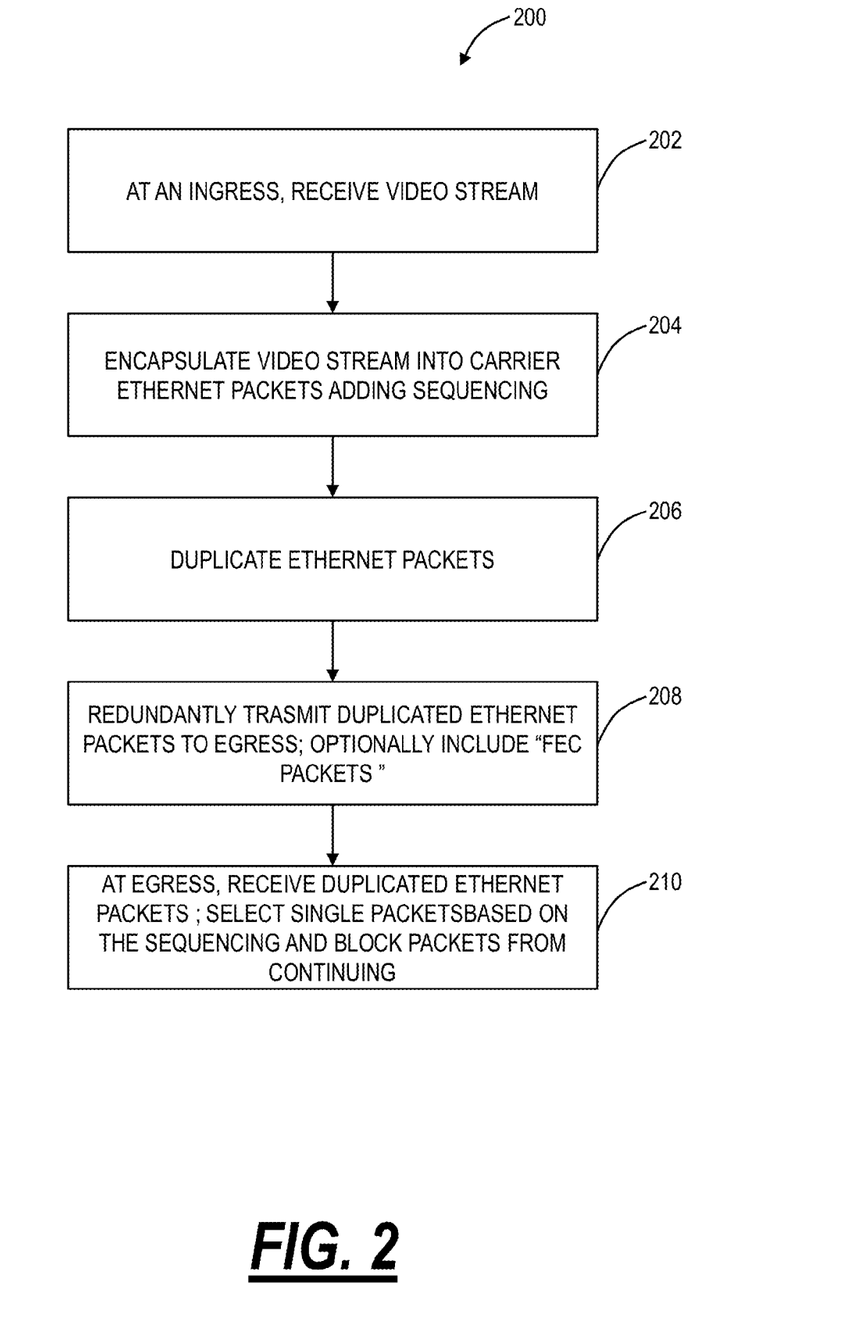
FIG. 2 is a flowchart of a transport method using the video transmission systems and methods.

Referring to FIG. 2, in an exemplary embodiment, a flowchart illustrates a transport method 200 using the video transmission systems and methods. In an exemplary embodiment, the transport method 200 may be implemented using the network 100. For example, the transport method 200 may be implemented at network nodes such as the nodes 102, 104 and across network links such as the links 112, 114. Alternatively, the transport method 200 may be implemented generally in any Carrier Ethernet network. At an ingress point, a video stream is received by the transport method 200 (step 202). As described herein, the video stream may include an uncompressed SMTPE stream such as, for example, SDI-SD, SDI-HD, SDI-3G, DVB-ASI, SDTI or HD-SDTI, TDM or dual-link 3G. The ingress point includes a device, such as the node 102, that is configured to receive the video stream and perform processing thereon. The ingress point is configured to encapsulate the video stream into Carrier Ethernet packets with sequencing (step 204). The video transmission systems and methods may utilize a protocol stack utilizing various aspects from Ethernet, VLAN tagging, Carrier Ethernet, Real Time Protocol (RTP), etc. For example, the transport method 200 may encapsulate the video streams into Carrier Ethernet packets (e.g., MEF8) with timestamp information and sequencing information. This may include a MEF8 frame format with additional header information. The sequencing information may include packet sequence numbers enabling an egress point to determine an order.

The ingress point is configured to duplicate the Ethernet packets (step 206). The duplicate packets are then redundantly transmitted to the egress point at Layer 2 (step 208). Optionally, the transmission includes additional packets which are referred to a FEC packets for error correction at Layer 2. In order to facilitate the hitless protection switching, the Ethernet packers are duplicated and sent out both WAN/Line Ports from the ingress point adding Video over Ethernet (VoE) traffic to the Carrier Ethernet network. These flows may forwarded through intermediate nodes based on VLAN ID (in MEF terms via pass-through Virtual Circuit Segments). At the egress point, a node dropping this VoE traffic receives two copies of this VoE traffic and does not forward (i.e. by blocking) the VoE traffic from continuing through the egress point, in order to prevent a traffic loop from occurring. The egress point selects one of the copies of the VoE traffic. For example, the egress point may be configured to select packets, based on the sequencing, from one of the links 112, 114. If a packet, based on the sequencing, is not available from the primary link, then the egress point may select the unavailable packets from the other or backup link. Additionally, the egress point may process the FEC packets to correct any errors.

Figure 3:
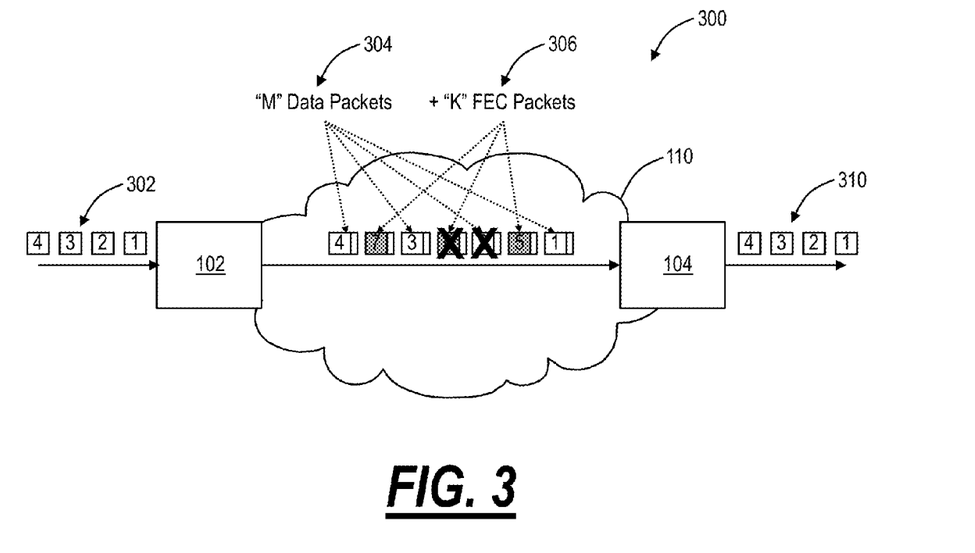
FIG. 3 is a network diagram of a packet FEC system and method between two nodes communicatively coupled by an optical network.

Referring to FIG. 3, in an exemplary embodiment, a network diagram illustrates a packet FEC system and method 300 between two nodes 102, 104 communicatively coupled by the optical network 110. In an exemplary embodiment, the optical network 110 may include Layer 1 protocols (e.g., SONET, SDH, OTN, etc.) with underlying FEC incorporated therein. For example, FEC in OTN (i.e., through a digital wrapper) may ensure a bit error rate (BER) less than $10^{-12}$ across the underlying optical network 110. However, occasional packet loss may still occur (e.g., micro-bursts in switching elements, etc.) in higher layers of the network thereby affecting the VoE traffic. In an exemplary embodiment, packet FEC at Layer 2 may mitigate these occasional events ensuring virtually lossless transport across the wide area network (WAN). Further, packet FEC is especially advantageous for real-time applications (e.g., SMPTE 2022-5 for live video transport) because—unlike {Transmission Control Protocol (TCP), Scalable TCP (STCP), UDP-based Data Transfer Protocol (UDT)}—packet FEC operates independent of the Round Trip Time (RTT). This may be advantageous for NRT (Non-Real-Time) applications, especially for truly global applications where RTT can be very significant impediment.

The packet FEC operates by the ingress node 102 receiving a video stream 302. The ingress node 102 may encapsulate the video stream 302 into Ethernet packets, such as using the transport method 200. The video stream 302 may be encapsulated into M data packets 304, M being an integer. The ingress node 102, as part of the encapsulation of the video stream 302 into Ethernet packets, may create additional K FEC packets 306, K being an integer, for the M data packets 304. Specifically, the K FEC data packets 306 include error correction data in the Layer 2 payload for the M data packets 304. At the egress node 104, the M data packets 304 are received, and the K FEC packets 306 may be processed to correct any defects in the M data packets 304. For example, the M data packets 304 may include data packets labeled 1, 2, 3, 4 and the K FEC packets 306 may include FEC packets labeled 5, 6, 7. In an exemplary embodiment, the K FEC packets 306 may be interspersed with the M data packets 304 at a set ratio such as, for example, every other packet data packet 304, one for every two data packets 304, one for every N data packets with N being an integer. In an exemplary operation, there packets labeled 2 and 6 are lost or included defects therein. The egress node 104 may utilize the other packets to perform error correction such that an uninterrupted output stream 310 is realized. In an exemplary embodiment, the packet FEC may be implemented via the Ethernet switch 130 and/or the video processing block 140 of the nodes 102, 104.

Figure 4:
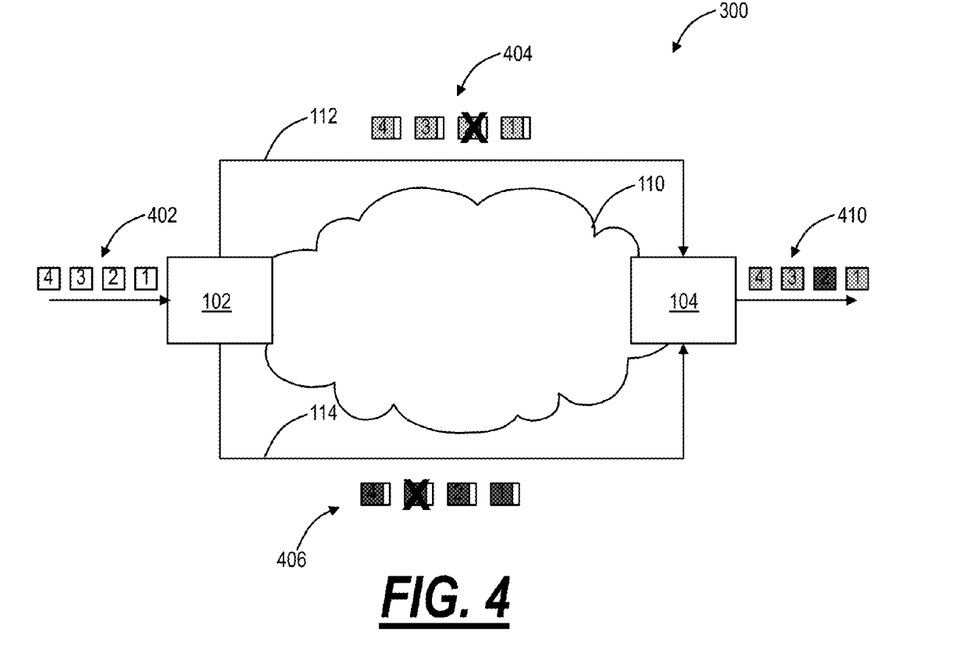
FIG. 4 is a network diagram of a virtually hitless protection switching system and method between two nodes communicatively coupled by an optical network.

Referring to FIG. 4, in an exemplary embodiment, a network diagram illustrates a virtually hitless protection switching system and method 400 between two nodes 102, 104 communicatively coupled by the optical network 110. Similar to the packet FEC system and method 300, the system and method 400 may be utilized with the network 100 and/or with the transport method 200. Further, the system and method 400 may be utilized with the packet FEC system and method 300 as well. In the system and method 400, the ingress node 102 receives a video stream 402. The ingress node 102 may encapsulate the video stream 402 into Ethernet packets, such as using the transport method 200. Specifically, each client ingress packet from the video stream 402 is encapsulated for transport across the WAN and/or the optical network 110 with each packet header including a unique timestamp and/or sequence number. The ingress node 102 is configured to perform onramp processing which includes replication of each packet and sending the replicated packets as two separate packet streams 404, 406 on two distinct paths, i.e. the links 112, 114. The links 112, 114 may include two physically diverse paths across the optical network 110 or WAN (i.e. likelihood of random event impacting both paths at the same time is near zero). Alternatively, the links 112, 114 may share some or all of the same paths across the optical network 110 where protection over these paths is limited to equipment failures.

At the egress node 104, the system and method 400 includes off-ramp processing which receives both the packet streams 404, 406 and reassembles the original data stream based on sequence number, discards duplicates, and re-sequences out of order frame. In an exemplary embodiment, the video stream 402 includes four packets labeled 1, 2, 3, 4 which are replicated and sent as the packet streams 404, 406. Assume that packet #2 on the stream 404 is lost or defective and the packet #3 on the stream 406 is lost or defective, and assume the stream 404 is the active, working, or primary stream. If a packet goes missing or defective on one link 114, 116, the system and method 400 reassembles the data stream using the packet with the same sequence number from the other side link. In this exemplary embodiment, the egress node 104 fails to receive packet #2 from the link 112, and instead uses the same packet from the link 114. The egress node 104 is not concerned with the failure to receive the packet #3 from the link 114 since it already receives it from the link 112. This reassembly provides a 100% hitless fashion (i.e., the client egress does not experience any perturbation whatsoever). Like the packet FEC system and method 300, the system and method 400 operates independent of network RTT, and hence is ideally suited for real-time applications which cannot afford "timeout/NACK→retransmit" mechanisms inherent in other mechanisms {TCP, STCP, UDT}.

Figure 5:
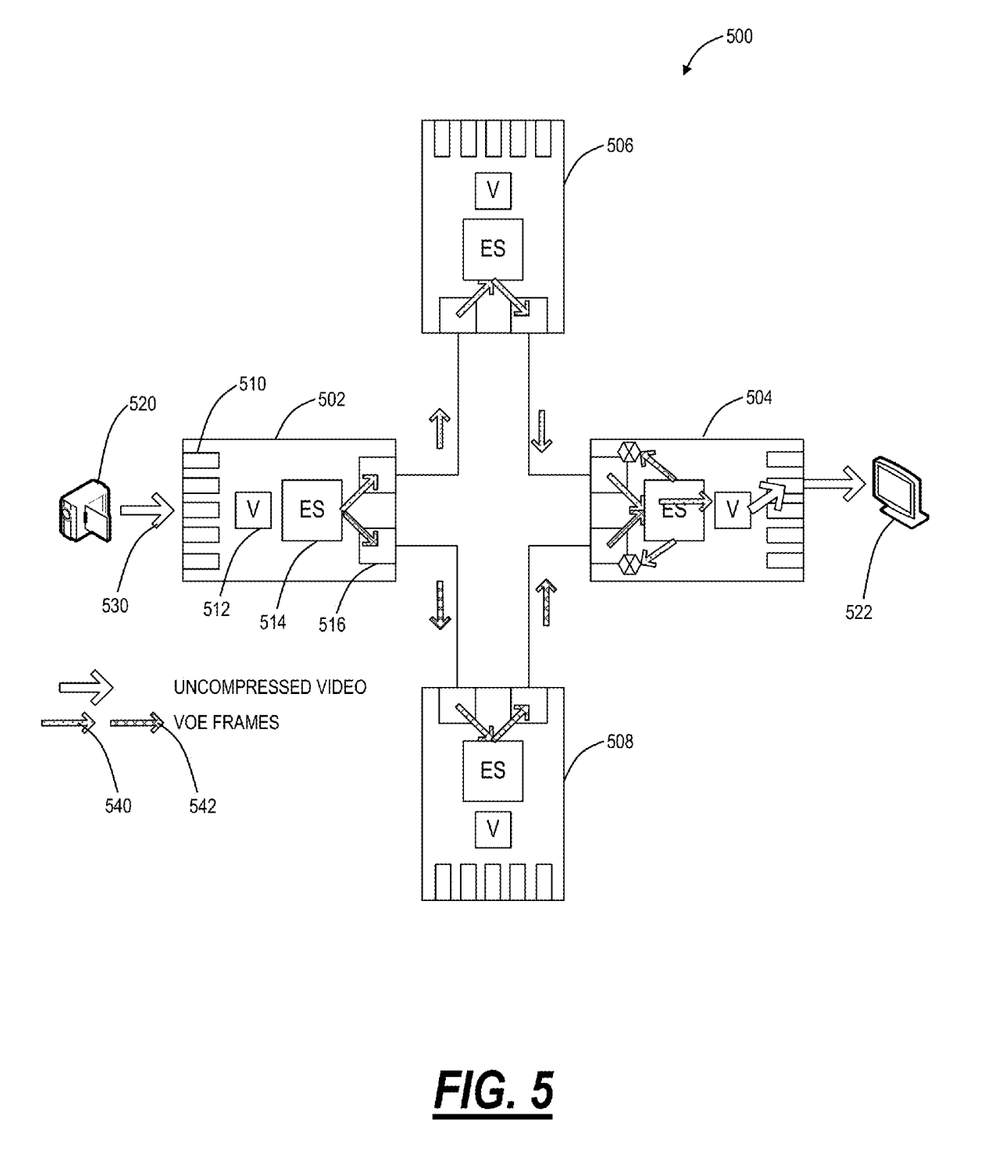
FIG. 5 is a network diagram of a Carrier Ethernet network of four interconnected nodes for transporting a video signal therebetween.

Referring to FIG. 5, in an exemplary embodiment, a network diagram illustrates a Carrier Ethernet network 500 of four interconnected nodes 502, 504, 506, 508 for transporting a video signal therebetween. Each of the nodes 502, 504, 506, 508 may include interface ports 510, a video processing block 512, an Ethernet switch 514, and line ports 516. The interface ports 510 are configured to interface to end users, such as a video source 520 and a video output 522 or intervening equipment therebetween. For example, the interface ports 510 may include a coaxial cable port which signals compliant to ITU-R BT.656 "Interface for digital component video signals ..." (2007), SMPTE 259M, SMPTE 292M, and the like. The video processing block 512 includes circuitry configured to interface video streams from the interface ports 510 to the Ethernet switch 514. The video processing block 512 may be configured to encapsulate the video streams into packets and the like. The Ethernet switch 514 is configured to switch the packets between the nodes 506, 508, 504 including transport of both redundant links.

In this example, there is a single uncompressed video source 520 at the node 502 which is the ingress node. The video source 520 is communicatively coupled to the video output 522 through the network 500. In particular, the video processing block 512 and/or the Ethernet switch 514 at the ingress node 502 are configured to send VoE traffic in both directions out of the node 502. For example, uncompressed video 530 is provided from the video source 520 to the interface ports 510. VoE frames 540, 542 representing the uncompressed video 530 are provided from the Ethernet switch 514 to each of the line ports 516 at the ingress node 502. The line ports 516 may be optical ports providing Ethernet over SONET, SDH, OTN, etc. or Ethernet direct over a wavelength. For example, the line ports 516 may be 10 Gb/s, 40 Gb/s, 100 Gb/s, etc., and may include a plurality of Ethernet streams along with other traffic. Generally, the line ports 516 may be referred to as WAN ports transmitting the VoE frames 540, 542 as uni-directional multicast traffic. VoE traffic through the VoE frames 540, 542 is sent from the ingress node 502 to the egress node 504. In particular, the VoE frames 540 are sent to the node 504 via the intermediate node 506, and the VoE frames 542 are sent to the node 504 via the intermediate node 508. At the intermediate nodes 506, 508, their associated Ethernet switches 514 are configured to forward the frames 540, 542 to the node 504. The egress node 504 is configured to no forward the VoE frames 540, 542 once received. In particular, the egress node 504 receives the duplicate VoE frames 540, 542, performs processing thereon (sequencing, error correction, etc.) and sends a single uncompressed video flow out to the video output 522.

Advantageously, the video transmission systems and methods provide transport of the video payload fully transparently. The video services may be delivered point-to-point or point-to-multipoint. For example, FIG. 5 illustrates a point-to-point configuration, i.e. from the node 502 to the node 504. In another exemplary embodiment, the video source 520 may transmit point-to-multipoint including video outputs at the nodes 506, 508 (not shown). The underlying Ethernet network may use linear Carrier Ethernet network topologies or Carrier Ethernet network topologies which employ G.8032 Ethernet Shared Protection Rings. The underlying optical network may include any type of topology as well including, for example, linear, ring, mesh, etc. Since the VoE traffic is redundantly multicast from the ingress point (e.g., through a card or circuit pack including the components 510, 512, 514, 516) out two network (WAN/Line) line ports 516, two copies of each VoE frame arrive at all destination nodes through two network ports 516. Under normal operation, the receiving devices, located on the nodes with destination drop ports, discard duplicate frames based on detecting duplicate sequence numbers within the VoE frames. Should one flow of traffic cease or get interrupted due to congestion or a hard network fault, the destination node uses the redundant flow of VoE frames, in order to continue the uninterrupted transmission of the video traffic out the destination ports. In an exemplary embodiment, the egress node 504 and/or all other nodes may include buffering circuitry for received VoE frames. Buffering on the egress nodes provides tolerance for frames arriving slightly early, or slightly late caused by latency caused by intermediate devices and latency caused by fiber transmission.

Figure 6:
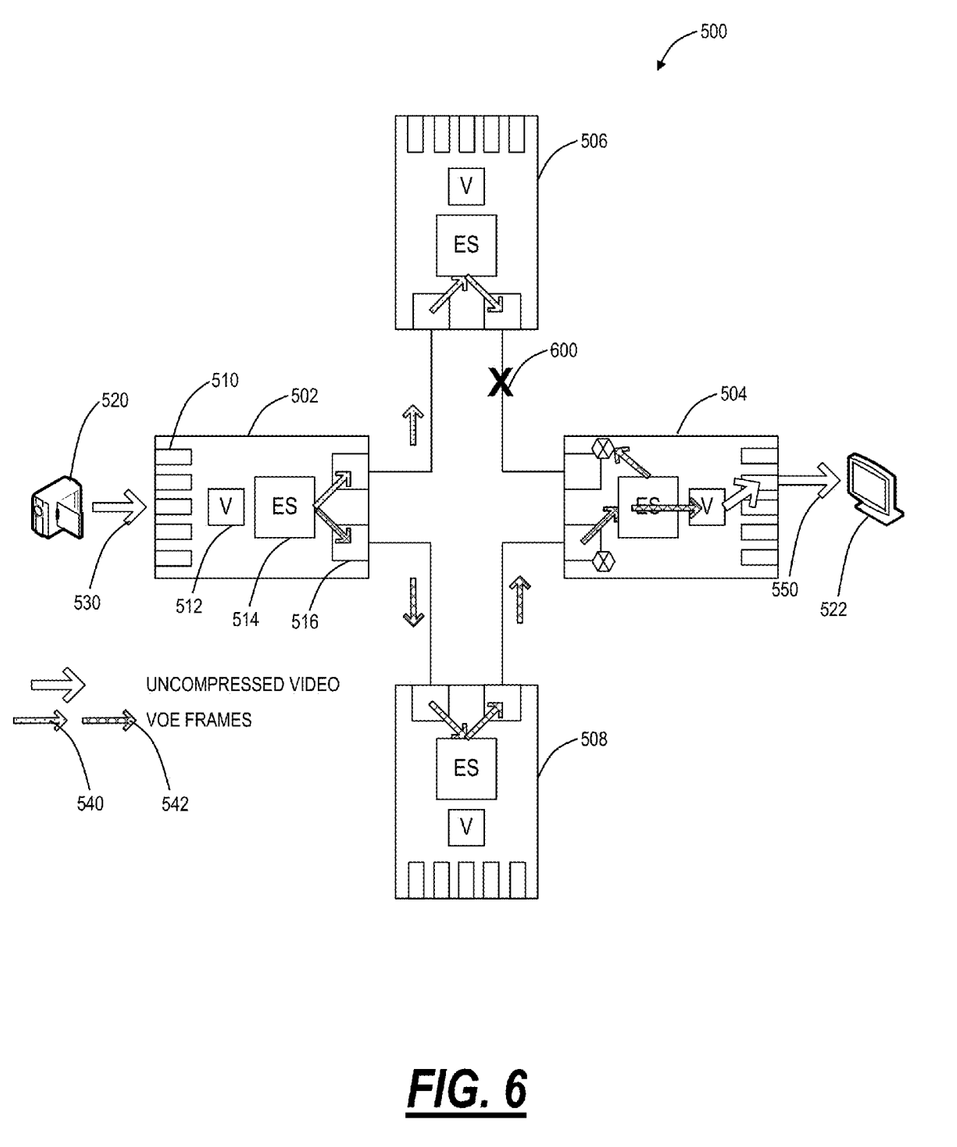
FIG. 6 is a network diagram of the Carrier Ethernet network of FIG. 5 illustrating a fault scenario and virtually hitless protection switching based thereon.

Referring to FIG. 6, in an exemplary embodiment, the Carrier Ethernet network 500 is illustrated with a fault scenario 600 and virtually hitless protection switching based thereon. In particular, FIG. 6 illustrates a fault 600 at or between the nodes 506, 504 thereby disrupting the VoE frames 540. Prior to the fault 600, the egress node 504 is receiving both the VoE frames 540, 542. The VoE frames 540, 542 include sequencing, time-stamping, and optionally packet FEC. The egress node 504 is processing both of the VoE frames 540, 542 utilizing the sequencing and time-stamping to provide an output 550 to the Video output 522. Upon the fault 600, the egress node 504 continues to receive the VoE frames 542 without receiving the VoE frames 540 due to the fault 600. By way of virtually hitless protection switching, the egress node 504 is configured to, based on the sequencing and time-stamping, provide the output 550 uninterrupted since the egress node 504 has the VoE frames 542 to select from despite the outage of the VoE frames 540.

Figure 7:
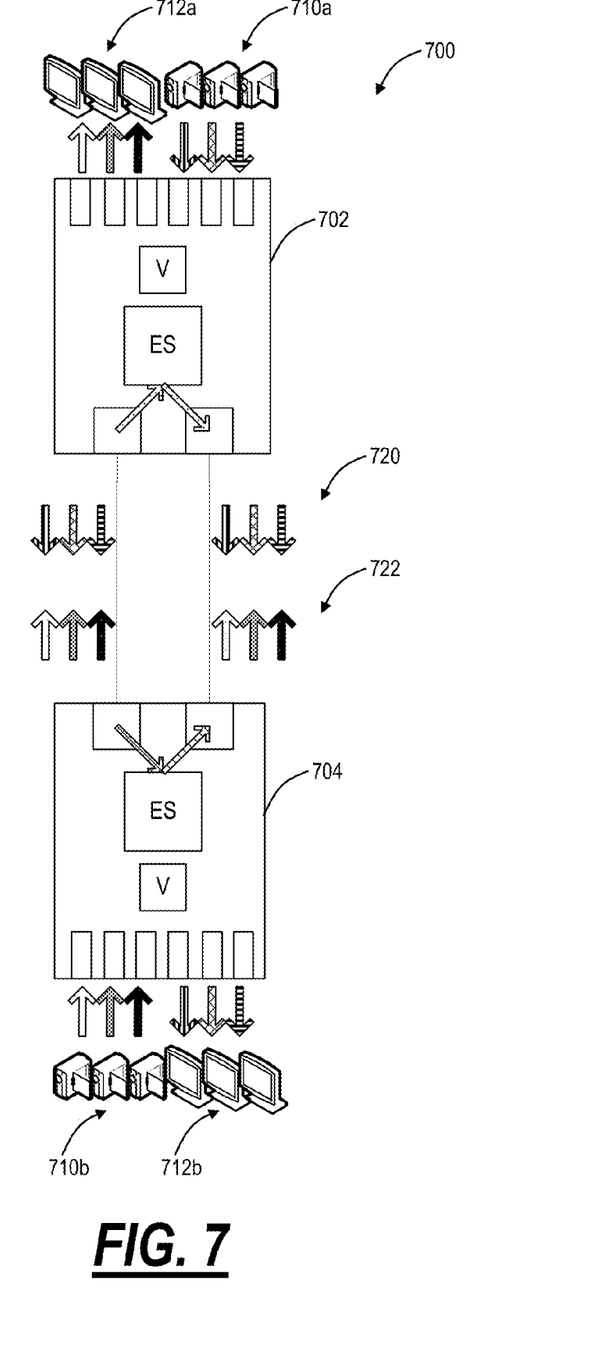
FIG. 7 is a network diagram of a network of two nodes in an exemplary point-to-point application showing a plurality of simultaneous Video over Ethernet (VoE) connections.
Figure 8:
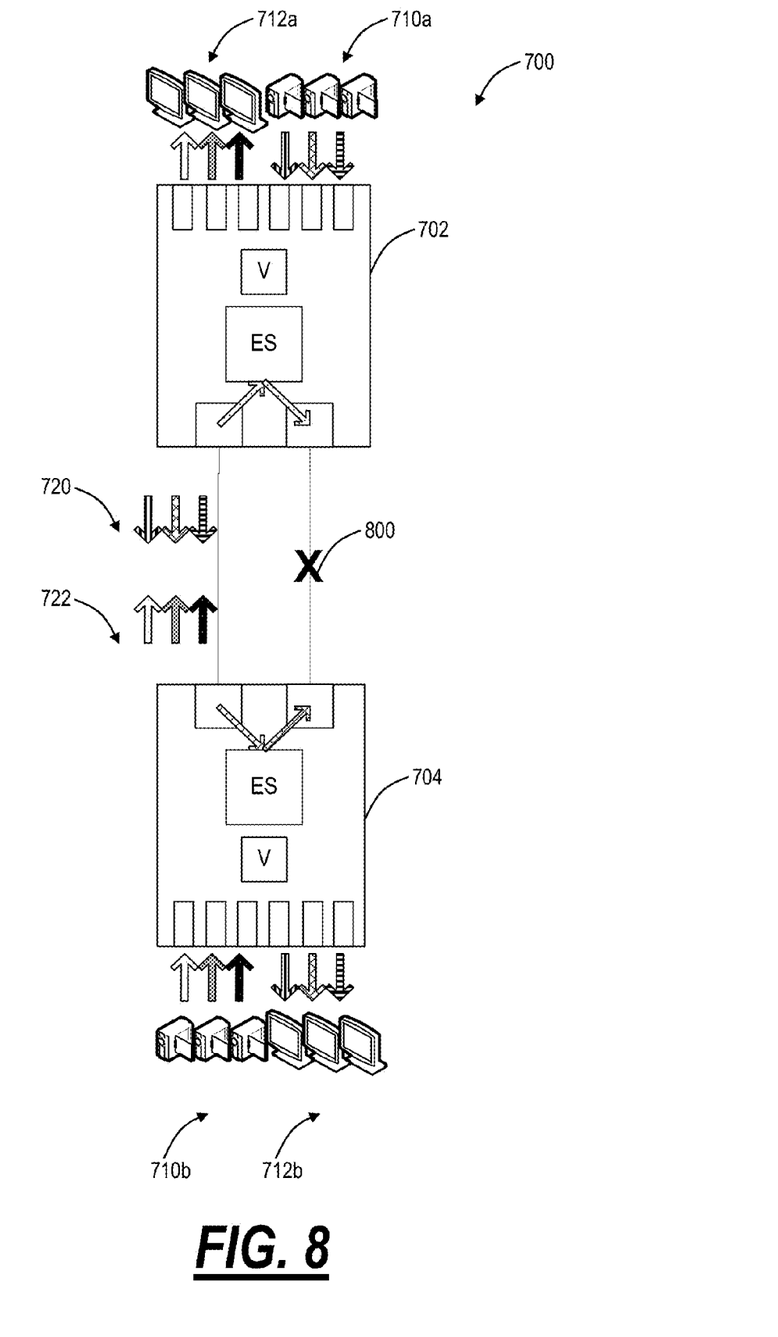
FIG. 8 is a network diagram of the network of FIG. 7 illustrating a fault scenario and virtually hitless protection switching based thereon.

Referring to FIGS. 7 and 8, in an exemplary embodiment, a network diagram illustrates a network 700 of two nodes 702, 704 in an exemplary point-to-point application showing a plurality of simultaneous VoE connections. The nodes 702, 704 similar to the nodes 502, 504, 506, 508 include the interface ports 510, the video processing block 512, the Ethernet switch 514, and the line ports 516. At the node 702, video sources 710a and video outputs 712a are connected to the interface ports 510, and at the node 704, video Sources 710b and video outputs 712b. In particular, the video sources 710a are communicatively coupled to the video outputs 712b and the video sources 710b are communicatively coupled to the video outputs 712a. There are VoE frames 720, 722 sent between the nodes 702, 704 using the video transmission systems and methods described herein. The VoE frames 720, 722 may be transmitted over a common optical signal (e.g., OTU2, OTU3, etc.). FIG. 8 shows a fault 800 on one of the links between the nodes 702, 704. Accordingly, the nodes 702, 704 utilize the VoE frames 720, 722 on the non-failed link. In particular, FIGS. 7 and 8 illustrates the fact that the video transmission systems and methods may also simultaneously provide hitless protection switching for multiple flows of traffic.

Figure 9:
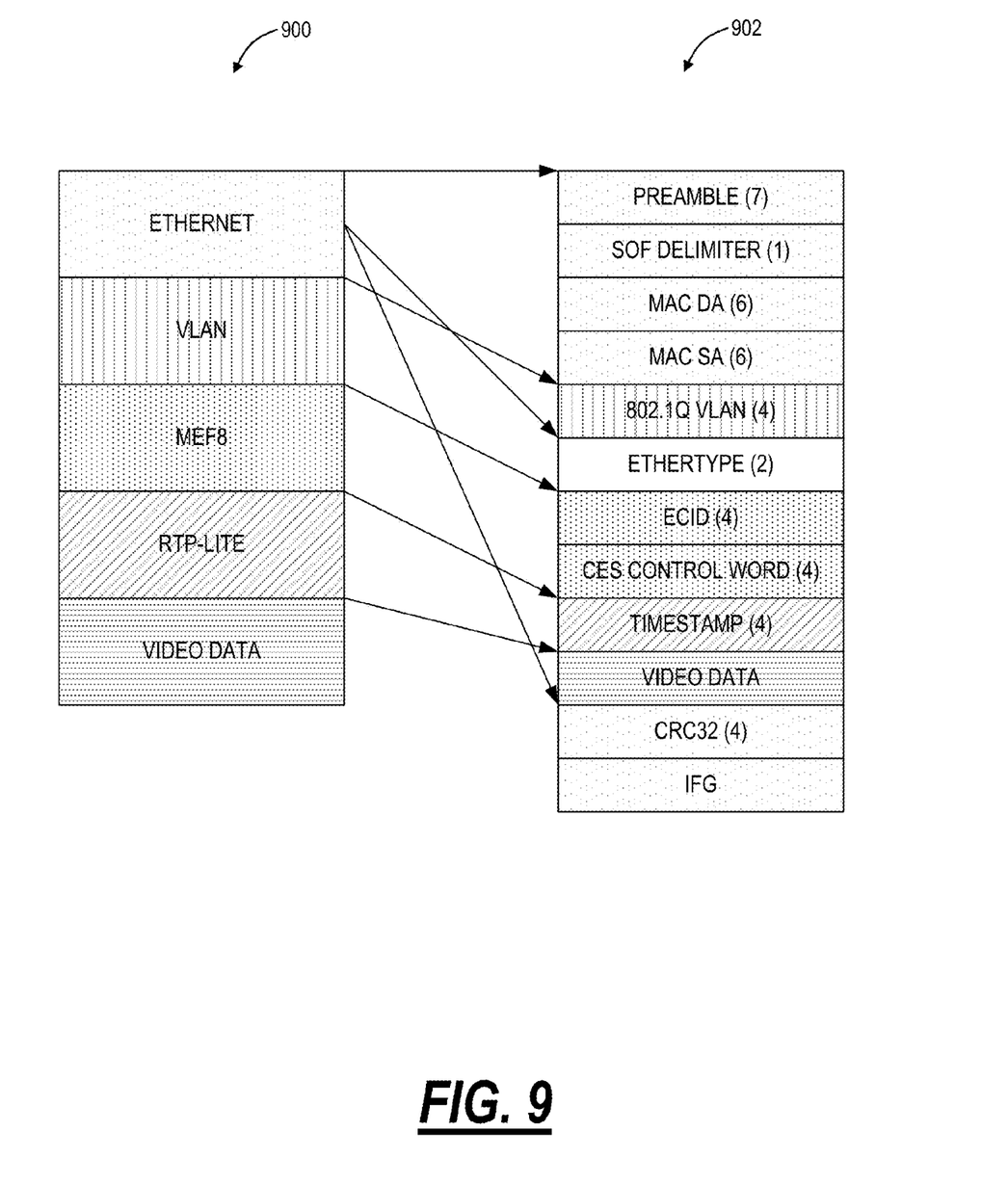
FIG. 9 is a block diagram of a protocol stack and corresponding frame structure for the video transmission systems and methods.

Referring to FIG. 9, in an exemplary embodiment, a block diagram illustrates a protocol stack 900 and corresponding frame structure 902 for the video transmission systems and methods. As described herein, the video transmission systems and methods utilize the protocol stack 900 with Ethernet, VLAN, MEF8, RTP-lite, and video data. In an exemplary embodiment, the frame structure 902 is utilized to transmit VoE frames and optionally to transmit FEC packets. The video transmission systems and methods may utilized a variety of possible encapsulations such as Q-tagged, Provider Backbone Bridging (PBB) (IEEE 802.1Qay tagged). The frame structure 902 is an exemplary frame structure for use by the video transmission systems and methods. Other structures are also contemplated by the video transmission systems and methods. In the frame structure 902, the video payload is augmented by an RTP-lite header (containing a timestamp), a MEF8 header (which adds sequence number and failure signaling), an IEEE 802.1Q VLAN header (for steering frames in the Carrier Ethernet Network), and an IEEE 802.3a Ethernet Header.

The frame structure 902 includes, for the Ethernet protocol, a preamble of 7 bytes, a start of frame (SOF) delimiter of 1 byte, a MAC destination address (DA) of 6 bytes, a MAC source address (SA) of 6 bytes, an Ethertype designation of 2 bytes, a CRC32 field of 4 bytes, and an inter-frame gap (IFG). The frame structure 902 may include an IEEE 802.1Q VLAN of 4 bytes for steering frames in the Carrier Ethernet network. The frame structure 902 may include an Emulated Circuit Identifier (ECID) of 4 bytes and a Circuit Emulation Services (CES) control word of 4 bytes for the MEF8 protocol. The MEF8 layer contains an ECID rate identifier and a format identifier which is used to advertise the information to the far end de-mapper termination point. The frame structure 902 may also include a timestamp of 4 bytes for the RTP-lite protocol layer. Client timing is derived from (timestamp) information embedded in the frames. The RTP-lite layer may include a timestamp based on a local reference clock.

Figure 10:
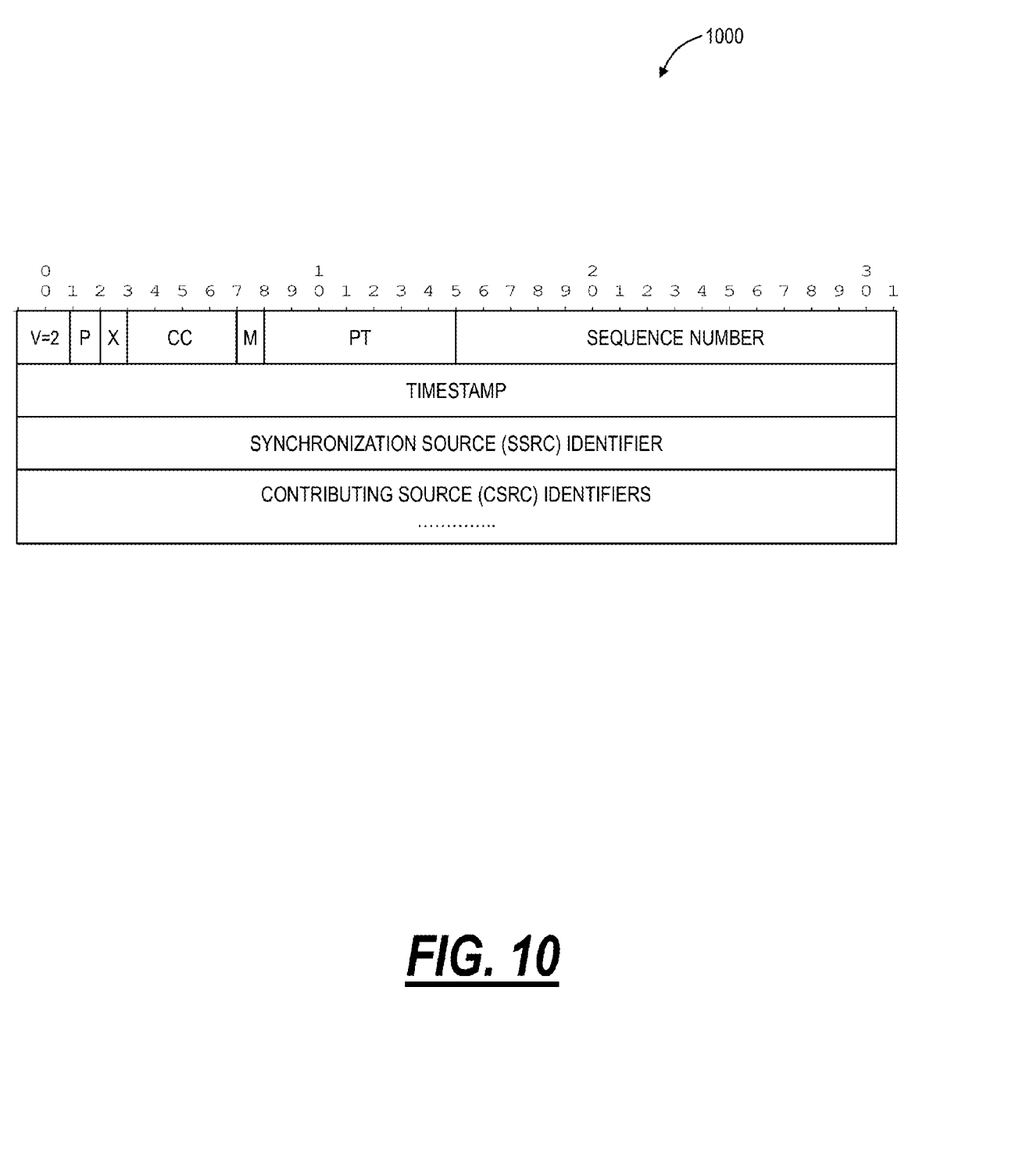
FIG. 10 is a block diagram of an exemplary header for a light Real Time Protocol (RTP-lite) protocol in the video transmission systems and methods.

Referring to FIG. 10, in an exemplary embodiment, a block diagram illustrates an exemplary header 1000 for the RTP-lite protocol in the video transmission systems and methods. As described herein, the video transmission systems and methods include sequencing and time-stamping. Collectively, this may be referred to as an RTP-lite protocol. In an exemplary embodiment, the header 1000 illustrates a frame structure for the RTP-lite protocol in the frame structure 902. In an exemplary embodiment, the video transmission systems and methods utilize a MEF frame with additional information through the header 1000, i.e. a MEF header plus an extra header for sequencing and time-stamping. The header 1000 includes a sequence number which may be utilized by the video transmission systems and methods to order VoE frames. Specifically, the ingress node is configured to set the sequence number, and the egress node utilizes the sequence number to ensure proper receipt and order of the VoE frames. Additionally, the header 1000 includes a timestamp, synchronization source (SSRC) identifier, and contributing source (CSRC) identifiers. In an exemplary embodiment, the video transmission systems and methods include a timing component at Layer 1 along with a timing delta through the frame structure 902 and the header 1000.

Figure 11:
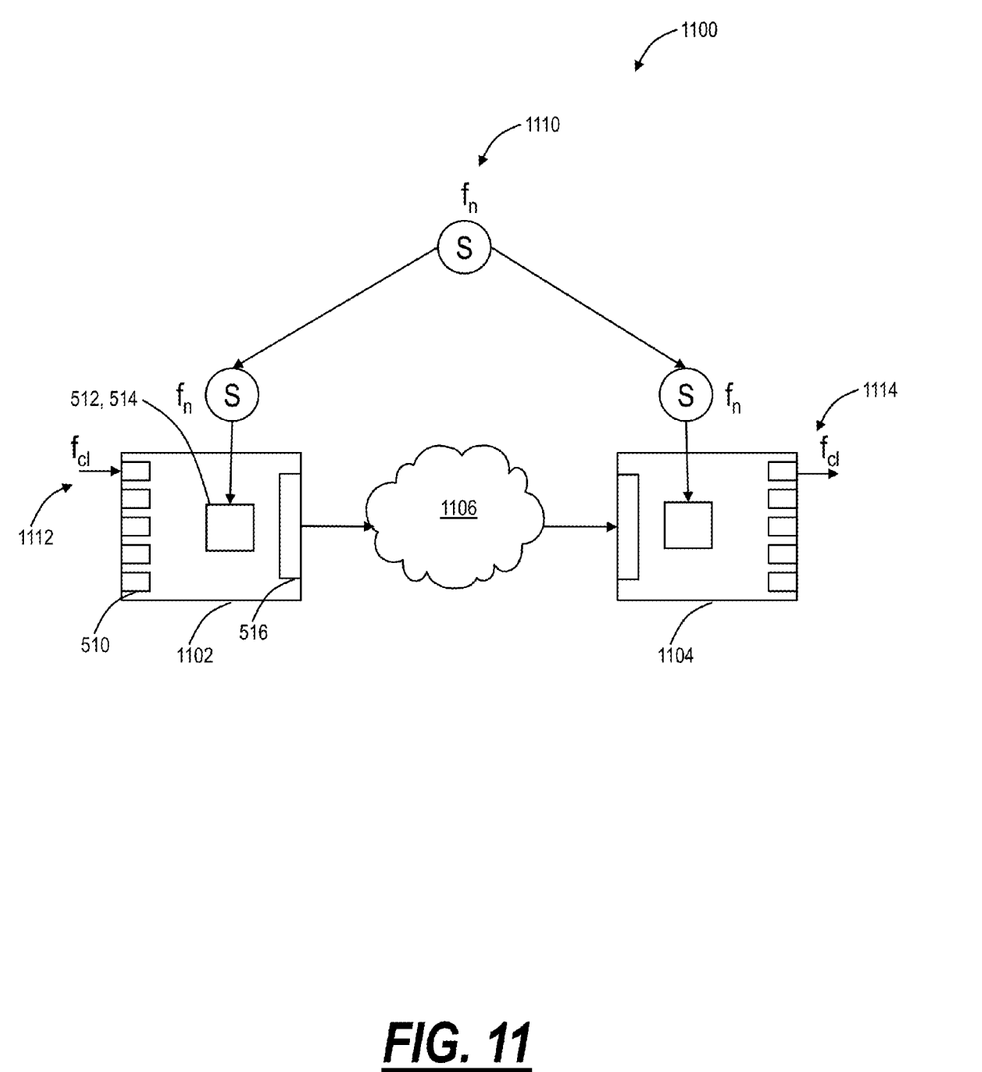
FIG. 11 is a network diagram of a network for timing in the video transmission systems and methods

Referring to FIG. 11, in an exemplary embodiment, a network diagram illustrates a network 1100 for timing in the video transmission systems and methods. In an exemplary embodiment, the video transmission systems and methods include an end-point clock recovery using a differential mode time recovery mechanism. The network 1100 includes two nodes 1102, 1104 interconnected by a network 1106 (i.e., Ethernet, Ethernet over SONET, OTN, etc.). Generally, there is a timing component at Layer 1 (e.g., SONET, SDH, OTN, etc.) with all nodes within the Carrier Ethernet Network synchronized at layer 1, and a timing delta is transmitted in the VoE headers. Note, conventional Ethernet can generally synchronize clocks to +/−100 ppm.

In an exemplary embodiment, the video transmission systems and methods may utilize G.8264 Ethernet Synchronization Status Messages (SSM) in order to convey clock quality and prevent timing loops. These Ethernet SSM messages may be embedded within separate Ethernet Control Frames, which are sent between the nodes within the Carrier Ethernet Network. These messages convey the quality level of a master clock 1110 and prevent timing loops. As part of this invention, the nodes 1102, 1104 have a method for provisioning timing reference preferences through a hierarchy. A master timing reference is chosen and all other nodes 1102, 1104 slave their clocks to the master according to the principals of G.8261. The master can be an external reference or can be a video node input port 1112. A receive end-point clock recovery 1114 uses a differential mode time recovery mechanism.

It will be appreciated that some exemplary embodiments may include one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the methods and/or systems described herein. Alternatively, some or all functions may be implemented by a state machine that has no stored program instructions, or in one or more application specific integrated circuits (ASICs), in which each function or some combinations of certain of the functions are implemented as custom logic. Of course, a combination of the two approaches may be used. Moreover, some exemplary embodiments may be implemented as a computer-readable storage medium having computer readable code stored thereon for programming a computer, server, appliance, device, etc. each of which may include a processor to perform methods as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), a Flash memory, and the like.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A Carrier Ethernet method, comprising:
   receiving an uncompressed video input stream at an ingress node;
   encapsulating the uncompressed video input stream into Ethernet packets comprising sequencing and timing added to Carrier Ethernet frames;
   duplicating the Ethernet packets;
   concurrently transmitting the duplicated Ethernet packets over separate line ports over a network; and
   receiving the duplicated Ethernet packets at an egress node and processing them.

2. The method of claim 1, further comprising:
   creating forward error correction packets for the Ethernet packets; and
   transmitting the forward error correction packets along with the duplicated Ethernet packets.

3. The method of claim 2, further comprising:
   upon receiving the duplicated Ethernet frames at the egress node, performing the steps of:
   ordering the Ethernet packets based on the sequencing;
   providing hitless protection switching by substituting lost or defective Ethernet packets with received duplicate Ethernet packets with a same sequence number; and
   repairing the lost or defective Ethernet packets utilizing the forward error correction packets.

4. The method of claim 1, further comprising:
   encapsulating the video input stream into Carrier Ethernet frames and adding a sequence number to each of the Carrier Ethernet frames.

5. The method of claim 4, further comprising:
   upon receiving the duplicated Ethernet frames at the egress node, performing the steps of:
   ordering the Ethernet packets based on the sequence number; and
   providing hitless protection switching by substituting lost or defective Ethernet packets with received duplicate Ethernet packets with a same sequence number.

6. The method of claim 1, further comprising:
   transmitting the duplicated Ethernet packets over separate line ports over the network based on a virtual local area network identification; and
   at the egress node, blocking transmission of the received duplicated Ethernet packets.

7. The method of claim 6, further comprising:
   at one or more intermediate nodes, forwarding the duplicated Ethernet packets based on the virtual local area network identification.

8. The method of claim 6, further comprising:
   transmitting to the network over a Layer 1 protocol with underlying synchronization; and
   providing a timestamp in the duplicated Ethernet packets, the timestamp providing a differential time recovery mechanism with the underlying synchronization.

9. The method of claim 8, further comprising:
   utilizing Ethernet synchronization status messages between the ingress node and the egress node to convey clock quality and prevent timing loops.

10. The method of claim 1, further comprising:
    receiving the duplicated Ethernet packets at a plurality of egress nodes in addition to the egress node and processing thereof.

11. The method of claim 1, further comprising:
    receiving the uncompressed video input stream comprising an uncompressed video signals at the ingress node.

12. A Carrier Ethernet network, comprising:
    an ingress node;
    one or more egress nodes;
    a network communicatively coupling the ingress node to the egress node;
    an uncompressed video signal interfacing the ingress node; and
    an Ethernet transport system for communicating the uncompressed video signal from the ingress node to the one or more egress nodes;
    wherein the Ethernet transport system is configured to transport the uncompressed video signals through Ethernet frames comprising sequencing and timing added to Carrier Ethernet frames; and
    wherein the Ethernet transport system is configured to transport the uncompressed video signal in a concurrent duplicated manner for virtually hitless protection switching.

13. The network of claim 12, further comprising:
    duplicate paths between the ingress node and the one or more egress nodes;
    wherein the Ethernet transport system is configured to:
    encapsulate the video input stream into Ethernet packets comprising sequencing and timing; and
    transmit duplicated Ethernet packets each over the duplicate paths.

14. The network of claim 13, further comprising:
    one or more intermediate nodes on one or more of the duplicate paths, wherein the Ethernet frames are forward based on a virtual local area network identification.

15. The network of claim 12, wherein the Ethernet transport system is configured to:
    provide forward error correction packets for the Ethernet frames; and
    transmit the forward error correction packets along with the Ethernet frames.

16. The network of claim 12, wherein the egress node is configured to:
    order received Ethernet frames based on the sequencing; and
    provide hitless protection switching by substituting lost or defective Ethernet frames with received Ethernet frames with a same sequence number based on the duplicated manner.

17. The network of claim 12, further comprising:
    a Layer 1 protocol between the ingress node and the one or more egress nodes, the Layer 1 protocol comprising an underlying synchronization; and
    a differential time recovery mechanism with the underlying synchronization.

18. A Carrier Ethernet network device, comprising:
    one or more interface ports;
    a video processing block;
    an Ethernet switch; and
    a plurality of line ports;

wherein the one or more interface ports are configured to interface to an uncompressed video signal;

wherein the video processing block is configured to encapsulate the uncompressed video signal into a plurality of Ethernet packets with aCarrier Ethernet header comprising added sequencing and timing; and wherein the Ethernet switch is configured to concurrently forward the plurality of Ethernet packets over a pair of the plurality of line ports.

19. The network device of claim 18, wherein the Ethernet switch is configured to:

receive duplicates of a second plurality of Ethernet packets comprising a second video signal;

order the second plurality of Ethernet packets based on sequencing and timing; and block forwarding of the second plurality of Ethernet packets.

* * * * *